United States Patent
Lu et al.

(10) Patent No.: US 10,820,438 B2
(45) Date of Patent: Oct. 27, 2020

(54) ELECTRONIC DEVICE AND STOPPING STRUCTURE THEREOF

(71) Applicant: ABILITY ENTERPRISE CO., LTD., New Taipei (TW)

(72) Inventors: Jih-Yung Lu, New Taipei (TW); Cheng-Kuang Tseng, New Taipei (TW); Yu-Cheng Huang, New Taipei (TW)

(73) Assignee: ABILITY ENTERPRISE CO., LTD., New Taipei (TW)

( * ) Notice: Subject to any disclaimer, the term of this patent is extended or adjusted under 35 U.S.C. 154(b) by 32 days.

(21) Appl. No.: 16/247,808

(22) Filed: Jan. 15, 2019

(65) Prior Publication Data
US 2019/0239375 A1 Aug. 1, 2019

(30) Foreign Application Priority Data
Jan. 26, 2018 (CN) .................... 2018 2 0134821 U (51) Int. Cl.
| | |
|---|---|
| *G02F 1/1333* | (2006.01) |
| *G06F 1/16* | (2006.01) |
| *H05K 5/06* | (2006.01) |
| *H05K 5/03* | (2006.01) |
| *H04M 1/02* | (2006.01) |
| *H04N 5/225* | (2006.01) |

(52) U.S. Cl.
CPC ....... *H05K 5/068* (2013.01); *G02F 1/133308* (2013.01); *G06F 1/1637* (2013.01); *H04M 1/0264* (2013.01); *H04N 5/2257* (2013.01); *H05K 5/03* (2013.01); *G02F 2001/13332* (2013.01); *G02F 2001/133311* (2013.01)

(58) Field of Classification Search
CPC .... H05K 5/068; H05K 5/03; G02F 1/133308; G02F 2201/46; G02F 2201/465; G02F 2201/503; G06F 1/1637; G06F 1/1656
See application file for complete search history.

(56) References Cited

U.S. PATENT DOCUMENTS

| | | | | |
|---|---|---|---|---|
| 4,272,838 A | * | 6/1981 | Kasama .............. | H01M 2/1044 368/242 |
| 5,119,204 A | * | 6/1992 | Hashimoto .............. | H04N 5/64 348/794 |
| 5,583,681 A | * | 12/1996 | Shioya .............. | G02F 1/133308 349/161 |
| 5,659,376 A | * | 8/1997 | Uehara ............. | G02F 1/133308 348/794 |

(Continued)

*Primary Examiner* — Adrian S Wilson
(74) *Attorney, Agent, or Firm* — McClure, Qualey & Rodack, LLP (57) ABSTRACT

An electronic device and a stopping structure thereof are provided. The electronic device includes a housing, an electronic element, a cover and a buffer. The housing has an opening. The electronic element is disposed corresponding to the opening. An outer frame of the cover is coupled to a peripheral edge of the opening. A hook of the buffer is disposed between the outer frame and the electronic element, and directly contacts with the outer frame. Thus, the above structure may strengthen the structural strength of the electronic device, effectively disperse the pressure applied to the electronic device, and reduce the chance of structural damage due to the deformation caused by the pressure to prolong the service life of the electronic device.

19 Claims, 6 Drawing Sheets

(56) References Cited

U.S. PATENT DOCUMENTS

| | | | | |
|---|---|---|---|---|
| 5,710,607 A * | 1/1998 | Iwamoto | G02F 1/133308 | 349/60 |
| 5,808,707 A * | 9/1998 | Niibori | G02F 1/133308 | 349/60 |
| 5,831,816 A * | 11/1998 | Johns | F16M 11/10 | 361/679.21 |
| 5,933,206 A * | 8/1999 | Niibori | G02F 1/13452 | 349/60 |
| 5,946,061 A * | 8/1999 | Kurihara | G02F 1/133308 | 349/58 |
| 6,118,434 A * | 9/2000 | Nishitani | B60K 35/00 | 340/438 |
| 6,151,207 A * | 11/2000 | Kim | G06F 1/1637 | 361/679.26 |
| 6,166,788 A * | 12/2000 | Ha | G02F 1/133308 | 349/58 |
| 6,216,329 B1 * | 4/2001 | Kaga | B29C 45/14467 | 264/247 |
| 6,295,105 B1 * | 9/2001 | Lee | G02B 6/0031 | 349/65 |
| 6,507,377 B1 * | 1/2003 | Jung | G02F 1/133308 | 349/58 |
| 6,532,152 B1 * | 3/2003 | White | G02F 1/133308 | 361/692 |
| 6,560,124 B1 * | 5/2003 | Irie | H05K 5/02 | 361/816 |
| 6,654,078 B1 * | 11/2003 | Kato | G02F 1/133308 | 349/58 |
| 6,788,894 B2 * | 9/2004 | Suzuki | G03B 17/48 | 348/333.01 |
| 6,859,357 B2 * | 2/2005 | Morimoto | G06F 1/1616 | 248/917 |
| 6,975,368 B2 * | 12/2005 | Lee | G02F 1/133308 | 349/58 |
| 7,209,195 B2 * | 4/2007 | Lin | G02F 1/133308 | 349/58 |
| 7,274,560 B2 * | 9/2007 | Jeong | G02F 1/133308 | 345/87 |
| 7,379,128 B2 * | 5/2008 | Tsubokura | G02F 1/13394 | 349/58 |
| 8,023,064 B2 * | 9/2011 | Ono | G02F 1/133308 | 349/60 |
| 8,050,023 B2 * | 11/2011 | Lee | H05K 5/02 | 345/156 |
| 8,199,488 B2 * | 6/2012 | Zou | B32B 3/02 | 312/223.1 |
| 8,582,048 B2 * | 11/2013 | Yu | G02B 6/0088 | 349/58 |
| 2002/0175836 A1 * | 11/2002 | Roberts | G06F 3/0414 | 341/34 |
| 2003/0020679 A1 * | 1/2003 | Kojima | G06F 1/1626 | 345/87 |
| 2007/0008687 A1 * | 1/2007 | Fukuda | G02F 1/133308 | 361/679.22 |
| 2007/0182877 A1 * | 8/2007 | Tanokuchi | H05K 5/02 | 349/58 |
| 2010/0103640 A1 * | 4/2010 | Brown | G06F 3/0414 | 361/829 |
| 2016/0216729 A1 * | 7/2016 | Ohtomo | G06F 1/1601 | |
| 2016/0270244 A1 * | 9/2016 | Ohtomo | G02F 1/133308 | |

\* cited by examiner

ELECTRONIC DEVICE AND STOPPING STRUCTURE THEREOF

This application claims the benefit of People's Republic of China Application No. 201820134821.8, filed Jan. 26, 2018, the disclosure of which is incorporated by reference herein in its entirety.

TECHNICAL FIELD

The disclosure relates to an electronic device, and more particularly to an electronic device and a stopping structure thereof with pressure resistance.

BACKGROUND

With the rapid development of technology, in order to meet the needs of users to use electronic devices in various environments, the specifications of various electronic devices, such as the handheld electronic devices like mobile phones, digital cameras or video cameras, for prevention of damage have been improved. For example, in the underwater environment, it is required to improve the specifications of the electronic device for pressure and water resistance measures so that the image can be taken at a specific depth below the water surface. However, when the electronic device is in an extreme environment, the electronic device may be damaged due to the structural strength of the body. For example, in an extremely deep underwater environment, because the local structural strength of the body is not uniform enough, the electronic device may lose the function of waterproof due to the deformation of the local portion of the electronic device under compression in a state where the water pressure is too high.

For example, taking a waterproof camera, since the waterproof camera's window is the appearance component of the body that has the most area receiving water pressure, when the waterproof camera is in an extremely deep underwater environment, water seepage often starts from the structure around the window. This causes damage of the waterproof camera and affects the life of the waterproof camera.

Therefore, how to develop a solution to improve the above drawback and inconvenience is an important issue that the relevant industry desires to resolve.

SUMMARY

According to one embodiment of the present disclosure, an electronic device is provided. The electronic device includes a housing, an electronic element and an elastomer. The housing has a first portion and a second portion. The elastomer has a hook and a base. The hook is disposed between the first portion and the electronic element, and abuts the first portion. The base is firmly disposed on the second portion.

According to another embodiment of the present disclosure, an electronic device is provided. The electronic device includes a housing, an electronic element, a cover and a buffer. The housing has an opening. The electronic element is disposed corresponding to the opening. An outer frame of the cover is coupled to a peripheral edge of the opening. A hook of the buffer is disposed between the outer frame and the electronic element, and the hook directly contacts with the outer frame.

According to an alternative embodiment of the present disclosure, an electronic device is provided. The electronic device includes a housing, a cover, a holder, an electronic element and a buffer. The housing has an opening. An outer frame of the cover is coupled to a peripheral edge of the opening. The holder has a side plate. The electronic element is disposed on the holder and disposed corresponding to the opening. The buffer is disposed between the outer frame and the electronic element, and one end of the buffer is connected to the side plate.

According to a further embodiment of the present disclosure, a stopping structure adapted for an electronic device is provided. The electronic device includes a housing and an electronic element. The stopping structure includes a cover, a holder and a buffer. The cover has an outer frame. The holder has a side plate. A hook of the buffer is sandwiched between the outer frame and the side plate. The outer frame of the cover is coupled to a peripheral edge of an opening of the housing. The electronic element is disposed on the holder and disposed corresponding to the opening.

The above description is only for explaining the problems to be solved, the technical means for solving the problems, the effects thereof, and the like of the present disclosure. A detailed description of the present disclosure will be described in the following embodiments and related drawings.

BRIEF DESCRIPTION OF THE DRAWINGS

The above and other objects, features, advantages and embodiments of the present disclosure will be more apparent and understood with the description of the drawings as follows.

DETAILED DESCRIPTION

In the following description, various embodiments of the present disclosure are disclosed with the following drawings, and for the sake of clarity, many of the details in practice will also be described. However, it should be understood by those skilled in the art that these details in practice are not essential to parts of embodiments of the present disclosure. Therefore, these details should not be a limitation to the present disclosure. Furthermore, to simplify the drawings, some well-known structures and elements are shown in the drawings with a simplified schematic representation. In addition, for the convenience for reading, the dimensions of various elements in the drawings are not drawn in actual scale.

Figure 1A:
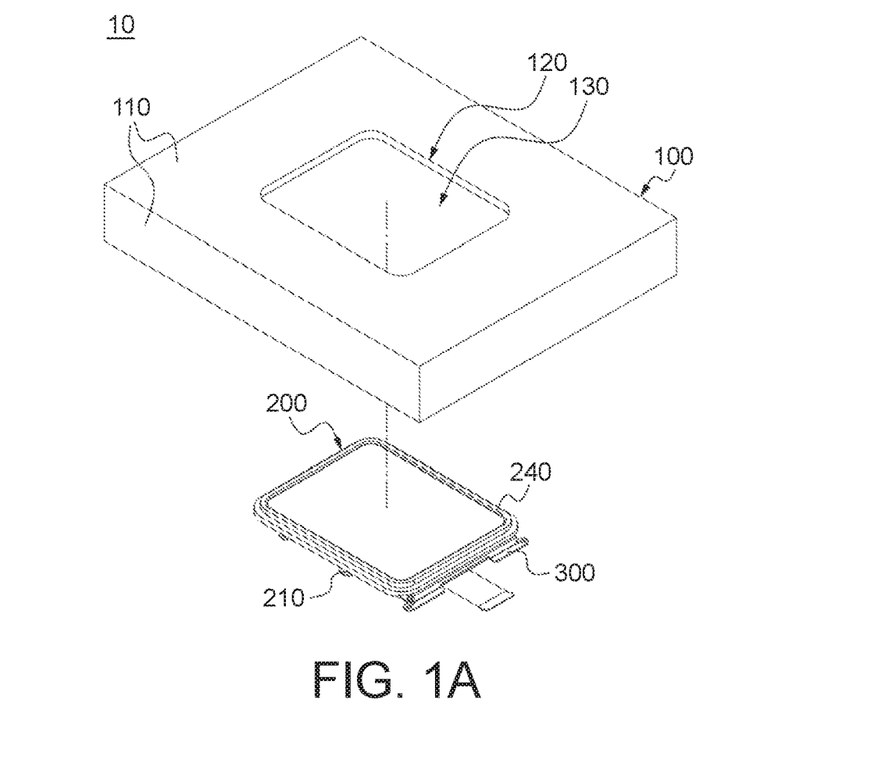
FIG. 1A shows a breakdown drawing of a housing and a stopping structure of an electronic device according to one embodiment of the present disclosure.
Figure 1B:
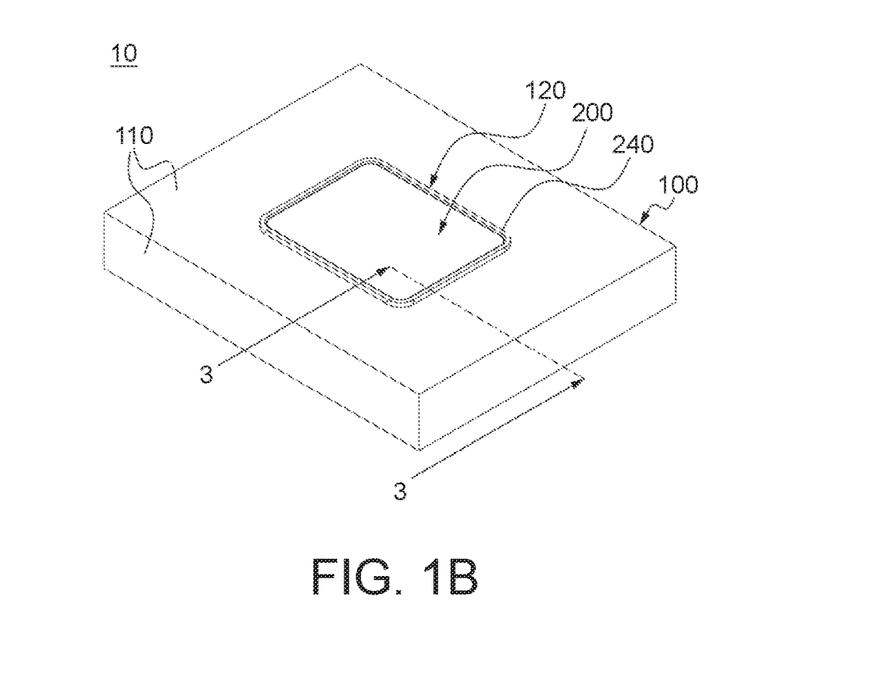
FIG. 1B shows an assembly drawing of the electronic device of FIG. 1A.

FIG. 1A shows a breakdown drawing of a housing 100 and a stopping structure 200 of an electronic device 10 according to one embodiment of the present disclosure. FIG. 1B shows an assembly drawing of the electronic device 10 of FIG. 1A. As shown in FIG. 1A and FIG. 1B, the electronic device 10 includes a housing 100 and a stopping structure 200. The housing 100 includes a plurality of side walls 110. These side walls 110 are connected to each other and form an accommodation space 130. An opening 120 communicating with the accommodation space 130 is formed at one of the side walls 110. The stopping structure 200 is set in the opening 120. In one embodiment, the stopping structure 200 is coupled to the housing 100 through the opening 120, a portion of the stopping structure 200 is exposed to the outside of the housing 100, and another portion of the stopping structure 200 is disposed in the accommodation space 130. The electronic device 10 further includes an electronic element disposed in the housing 100 and disposed corresponding to the opening 120. The stopping structure 200 may support the housing. In in different embodiment, the electronic device 10 is a handheld electronic device, such as digital camera, video camera, and mobile phone, and the electronic element is an element or a module such as display module, optical lens and illumination lamp.

Figure 2:
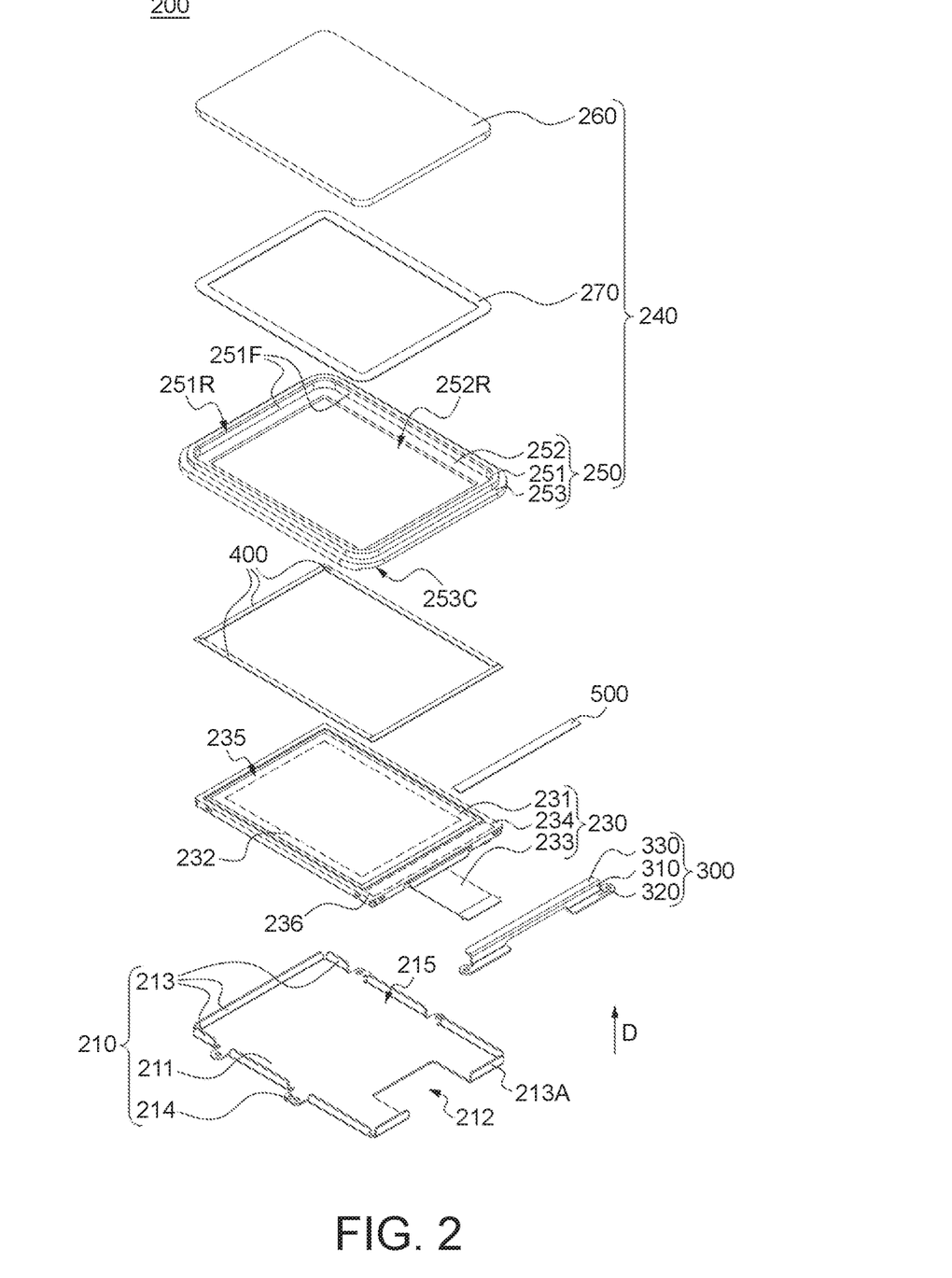
FIG. 2 shows a breakdown drawing of the stopping structure of FIG. 1A.
Figure 3:
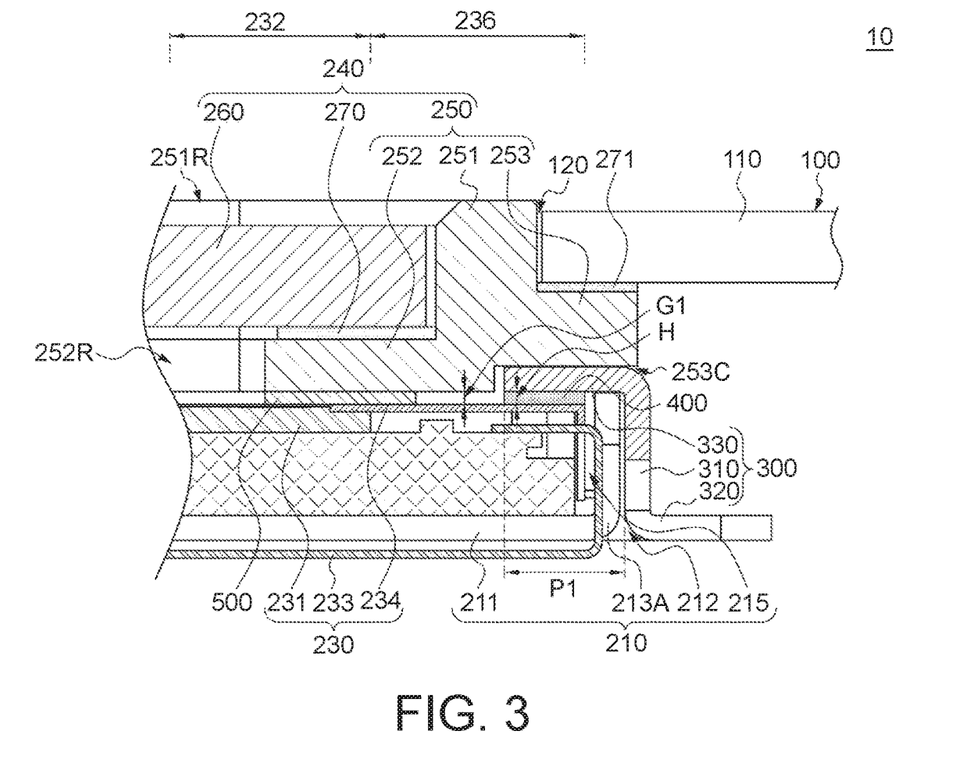
FIG. 3 shows a partially cross-sectional view of the electronic device of FIG. 1B along line 3-3.

FIG. 2 shows a breakdown drawing of the stopping structure 200 of FIG. 1A. FIG. 3 shows a partially cross-sectional view of the electronic device 10 of FIG. 1B along line 3-3. As shown in FIG. 2 and FIG. 3, the stopping structure includes a holder 210, a cover 240 and a buffer 300. The cover 240 is coupled to a peripheral edge of the opening 120. The holder 210 is disposed in the housing 100 and holds an electronic element. In other words, the electronic element is disposed on the holder 210 and disposed between the holder 210 and the cover 240. However, in another embodiment, the stopping structure 200 may not include the holder 210, and the electronic element may be set on the internal surface of the housing 100 or an extending structure on the internal surface of the housing 100, or set on other structure or assembly on the internal surface of the housing. However, the present disclosure is not limited thereto.

In the present embodiment, the electronic element includes an exposing area 232 and a non-exposing area 236. The non-exposing area 236 is disposed on one side of the exposing area 232. The exposing area 232 and the non-exposing area 236 are adjacent to each other, or the exposing area 232 and the non-exposing area 236 are connected to each other as shown in FIG. 3. In the present embodiment, the electronic element is a display module 230. The exposing area 232 includes the active area (AA) of the display module 230, and the non-exposing area 236 includes the outer lead bonding (OLB) area of the display module 230. However, the present disclosure is not limited thereto. In another embodiment, the exposing area 232 includes the active area and the view area (VA). In other words, some or entire of the exposing area 232 may be visible through the opening 120, and the non-exposing area 236 is invisible due to the shield of the housing 100 or the cover 240.

The buffer 300 is disposed between the housing 100 and the display module 230. In one embodiment, the buffer 300 abuts the housing 100 or the cover 240. For example, a portion of the buffer 300 is disposed between the cover 240 and the non-exposing area 236 of the display module 230, and directly contacts with the cover 240. Furthermore, the portion of the buffer 300 may also abut the housing 100 in different ways to apply force to the housing. For example, the portion of the buffer 300 directly contacts with the housing 100, or abuts the housing by glue or other ways. In one embodiment, the portion of the buffer 300 and the non-exposing area 236 of the display module 230 are separated by a spacing H. That is, the portion of the buffer 300 and the display module 230 are not in contact with each other or connected to each other. Therefore, the cover 240 is spaced from the display module 230 by the buffer 300. Another portion of the buffer 300 is disposed on the housing 100. For example, the another portion of the buffer 300 is firmly disposed on the internal surface of the housing 100; or, a structure extends from the internal surface of the housing 100, and the another portion of the buffer 300 may also be firmly disposed on this structure so as to be disposed on the housing 100; or, the electronic device 10 further includes other structures or elements that are fixed on the internal surface of the housing 100, and the another portion of the buffer 300 may be firmly disposed on these structures or elements to be disposed on the housing 100. However, in other embodiment, the buffer 300 may not directly contact with the housing 100 or the cover 240.

In one embodiment, the buffer 300 is an elastomer. When the buffer 300 is subjected to a force, this external force can be buffered by the elasticity of the buffer 300. The elasticity of the buffer 300 may be provided by the material of the buffer 300 itself, or by the shape of the buffer 300. For example, the material of the buffer 300 is at least one of the metal, plastic and rubber, or a combination of metal, plastic and rubber with other component, or composed of metal, plastic or rubber and so on. The buffer 300 may be formed into a zigzag, or a shape of bending structure, or other shape which may provide elasticity by combining with other component. However, the present disclosure is not limited thereto. When an external force applies to the housing 100 or the cover 240, this external force can be transferred to the buffer 300. In addition, this external force is not transferred to the display module 230 or the non-exposing area 236 thereof underneath the buffer 300 since a spacing exists between the buffer 300 and the non-exposing area 236. This prevents the cover 240 from directly pressing the display module 230, thereby reducing the chance of excessive compression and damage to the display module 230 and the non-exposing area 236 thereof.

Referring to FIG. 2, the holder 210 includes a bottom plate 211 and at least one side plate 213A. In the present embodiment, the holder 210 includes a plurality of side plates 213, 213A. These side plates 213, 213A are respectively connected to the bottom plate 211 and extend along a direction D, e.g., a direction towards the cover 240. In addition, the holder 210 has an accommodation space 215 defined by the side plates 213, 213A and the bottom plate 211. The display module 230 is disposed on the bottom plate 211 and accommodated in the accommodation space 215. In the present embodiment, the holder 210 further includes a plurality of lugs 214. The lugs 214 are respectively connected to two opposite sides of the bottom plate 211, and are substantially located in the same plane with the bottom plate 211. Furthermore, the lugs 214 are respectively disposed between two of the side plates 213. In one embodiment, the holder 210 further has a receiving opening 212. The receiving opening 212 is located on one side edge of the bottom plate 211 corresponding to the non-exposing area 236 of the display module 230, and located between two side plates 213A which are connected to the above-mentioned side edge of the bottom plate 211.

In one embodiment, the display module 230 is a liquid crystal display (LCD). For example, referring to FIG. 2, the display module 230 at least includes a display panel 231, a flexible circuit board 233 and a frame 234. The frame 234 has a frame opening 235. The frame 234 covers the display panel 231 and is set on the display panel 231 thus to protect the display panel 231. In the present embodiment, the exposing area 232 includes a portion of the display panel 231 where images can be displayed, such as the active area or the view area. Some or entire of the exposing area 232 may be exposed to the outside of the frame 234 through the frame opening 235. The non-exposing area 236 includes the outer lead bonding area electrically connected to the display panel 231, and is covered with the frame 234 instead of being exposed to the outside of the frame 234. However, in other embodiment, the display panel 231 includes an active area, a view area and an outer lead bonding area. One end of the flexible circuit board 233 is disposed in the accommodation space 215 and electrically connected to the non-exposing area 236. Another end of the flexible circuit board 233 may be fold over each other and disposed behind the display panel 231, and protrudes from the receiving opening 212 of the holder 210. The flexible circuit board 233 is electrically connected to other control circuitry within the electronic device 10, so that the display panel 231 or other control circuitry can perform corresponding operations. The flexible circuit board 233 in the present embodiment is a flexible cable, but the present disclosure is not limited thereto. It should be noted that the structure of the display module 230 as shown in the drawings of the present disclosure is just used for explanation instead of limiting the type and the structure of the display module 230.

Referring to FIG. 2 and FIG. 3, the cover 240 includes an outer frame 250 and an optically transmissive sheet 260. The outer frame 250 is coupled to the peripheral edge of the opening 120, and the optically transmissive sheet 260 is disposed on the outer frame 250.

Specifically, the outer frame 250 has a surrounding body 251, an outer ring portion 253 and an inner ring portion 252. The internal side surface 251F of the surrounding body 251 encircles a first surrounding space 251R. The first surrounding space 251R may be a through hole or an opening that communicates upper side and lower side. There is no limitation to the shape, size or area of the first surrounding space 251R, it may be determined according to the shape, volume of the element accommodated in the first surrounding space 251R or according to the shape, size or area of the display module 230. The outer ring portion 253 is disposed around the outer side surface of the surrounding body 251, and surrounds the surrounding body 251 in a closed manner. One surface of the outer ring portion 253 (e.g., the top surface) is connected to the surface of the side wall 110 of the housing 100 by a bonding glue 271. The inner ring portion 252 is disposed around the inner side of the surrounding body 251 and forms a second surrounding space 252R. The second surrounding space 252R may also be a through hole or an opening that communicates upper side and lower side, and communicate with the first surrounding space 251R. The size or area of the second surrounding space 252R is substantially slightly smaller than the size or area of the first surrounding space 251R. The second surrounding space 252R is located between the exposing area 232 of the display module 230 and the first surrounding space 251R. Thus, some or entire of the exposing area 232 of the display module 230 may be exposed through the second surrounding space 252R and the first surrounding space 251R (as shown in FIG. 2).

The outer frame 250 has an accommodation portion which may accommodate the buffer 300. In the present embodiment, the accommodation portion of the outer frame 250 includes a recess region 253C. Specifically, the recess region 253C is disposed on the bottom surface of the outer frame 250. In one embodiment, the bottom surface of the outer frame 250 may be inwardly recessed from the outer side of the outer ring portion 253 to the inner ring portion 252 to form the recess region 253C. A portion of the buffer 300 is accommodated in the recess region 253C, and directly contacts with the outer frame 250 of the cover 240 to abut the cover 240.

The outer frame 250 may be connected to the optically transmissive sheet 260 and the housing 100 respectively by the bonding glues 270, 271, so that the outer frame 250, the optically transmissive sheet 260 and the housing 100 may be air-tightly joined to each other. Specifically, the optically transmissive sheet 260 is disposed in the first surrounding space 251R, and connected to one surface of the inner ring portion 252 (e.g., the top surface) by the bonding glue 270. Another surface of the inner ring portion 252 (e.g., the bottom surface) and the display module 230 (or the non-exposing area 236 of the display module 230) are separated by a spacing H, but the present disclosure is not limited thereto. In the present embodiment, the portion of the bottom surface of the outer frame 250 corresponding to the inner ring portion 252 is also referred to as the bottom surface of the inner ring portion 252, and the portion of the bottom surface of the outer frame 250 corresponding to the outer ring portion 253 is also referred to as the bottom surface of the outer ring portion 253. Since the outer frame 250 is provided with the recess region 253C, the spacing between the bottom surface of the inner ring portion 252 and the display module 230 may be smaller than the spacing between the bottom surface of the outer ring portion 253 and the display module 230, but the present disclosure is not limited thereto.

The outer frame 250 of the present embodiment is a decorative part, but the present disclosure is not limited thereto. Furthermore, the outer frame 250 of the present embodiment is made from the material or organic material of, for example, rubber, plastic or silica gel, and may further be an air-impermeable material. However, the present disclosure is not limited thereto.

Referring to FIG. 2 and FIG. 3, the buffer 300 includes a connection portion 310, a hook 330 and a base 320. In above-mentioned embodiments, a portion and another portion of the buffer 300 may respectively be the hook 330 and the base 320. The connection portion 310 is an upright plate. The hook 330 and the base 320 are respectively connected to two opposite ends of the connection portion 310, and respectively extend towards opposite directions. The hook 330 and the base 320 may not be aligned in a line. The base 320 is fastened inside the housing 100 by screws or bolts (not illustrated). The hook 330 extends inside the recess region 253C of the outer frame 250. At least a portion of the orthogonal projection P1 of the hook 330 to the display module 230 is located on the non-exposing area 236 of the display module 230. The buffer 300 abuts the outer frame 250 of the cover 240 through the hook 330 located in the recess region 253C.

In one embodiment, the hook 330 is further disposed between the cover 240 and at least one side plate 213A of the holder 210. Referring to FIG. 2 and FIG. 3, for example, the hook 330 has one surface and another surface opposite to the one surface. The one surface of the hook 330 directly contacts with the bottom surface of the outer frame 250 of the cover 240, and the side plate 213A abuts another surface of the hook 330, so that the hook 330 is sandwiched between the cover 240 and the side plate 213A. Thus, the supporting strength of the hook 330 may be further enhanced by the support of the side plate 213A of the holder 210.

Referring to FIG. 2 and FIG. 3, in one embodiment, the stopping structure 200 further includes one or more soft elements 400. The soft element 400 is disposed between the electronic element (e.g., the display module 230) and the cover 240. For example, the soft element 400 is attached to the electronic element. To offer the display module 230 as the electronic element as an example, the soft element 400 is attached to the frame 234, and arranged along the edge of the display module 230. The soft element 400 is sandwiched between the display module 230 and the cover 240 (or the outer frame 250). One of the soft elements 400 is sandwiched between the hook 330 of the buffer 300 and the frame 234 of the display module 230. In the present embodiment, the thickness of the soft element 400 is substantially equal to the height of the spacing H, but the present disclosure is not limited thereto. The soft element 400 is made from a soft material such as foam, but the present disclosure is not limited thereto. The soft element 400 may block dust or external force to prevent the display module 230 (or the display panel 231) from being stained or excessively compressed. In other embodiment, the soft element 400 may be omitted.

The stopping structure 200 further includes an insulating sheet 500. Referring to FIG. 3, the insulating sheet 500 is disposed on the electronic element (e.g., the display module 230). For example, the insulating sheet 500 may be disposed on the frame 234 of the display module 230 by attaching and sandwiched between the inner ring portion 252 of the outer frame 250 and the display module 230. In one embodiment, a spacing exists between the insulating sheet 500 and the soft element 400 disposed between the hook 330 and the non-exposing area 236.

More specifically, one of the soft elements 400 is sandwiched between the hook 330 and the non-exposing area 236, and this soft element 400 is disposed on one side of the non-exposing area 236 which is away from the exposing area 232. The insulating sheet 500 is disposed on both of the exposing area 232 and the non-exposing area 236. For example, the insulating sheet 500 covers both of one side of the non-exposing area 236 which is close to the exposing area 232 and one side of the exposing area 232 which is close to the non-exposing area 236. The bottom surface of the inner ring portion 252 of the cover 240, the surface of the display module 230 facing the cover 240, the side surface of the insulating sheet 500 and the side surface of the soft element 400 disposed between the hook 330 and the non-exposing area 236 together define a gap G1. That is, the bottom surface of the outer frame 250 other than the portion of the recess region 253C and the display module 230 form a gap G1 therebetween. Thus, through the hook 330, the soft element 400 located between the non-exposing area 236 of the display module 230 and the hook 330, and the insulating sheet 500, the outer frame 250 of the cover 240 does not directly contact with the display module 230. The gap G1 and the spacing H of the present disclosure may substantially have the same height, but the present disclosure is not limited thereto.

For example, the insulating sheet 500 is strip-shaped, but the present disclosure is not limited thereto. For example, the insulating sheet 500 is made from other hard material such as MYLAR, and may be made from a non-conductive material. However, in other embodiments, a person having ordinarily skill in the art may also choose not to use the insulating sheet 500.

Since the buffer 300 and the insulating sheet 500 respectively contact with the cover 240, when an external force is applied to the cover 240, this external force may be transferred to the buffer 300 or the insulating sheet 500. In one embodiment, this external force may also be transferred to the soft element 400 which is in contact with the buffer 300. In another embodiment, this external force is absorbed by the buffer 300 without being transferred to the insulating sheet 500 and/or the soft element 400. That is, the external force applied to the cover may be buffered by the buffer 300 disposed between the cover 240 and the holder 210 (or the electronic element), the soft element 400 and the insulating sheet 500.

Different embodiments will be described below to illustrate the electronic devices and the stopping structures thereof of the present disclosure. FIGS. 4-7 respectively show partially cross-sectional views of the electronic devices of different embodiments of the present disclosure, the viewing direction of which are the same with FIG. 3. The electronic devices shown in FIGS. 4-7 are substantially the same as the electronic device of FIG. 3, and the same components are denoted by the same reference numerals.

Figure 4:
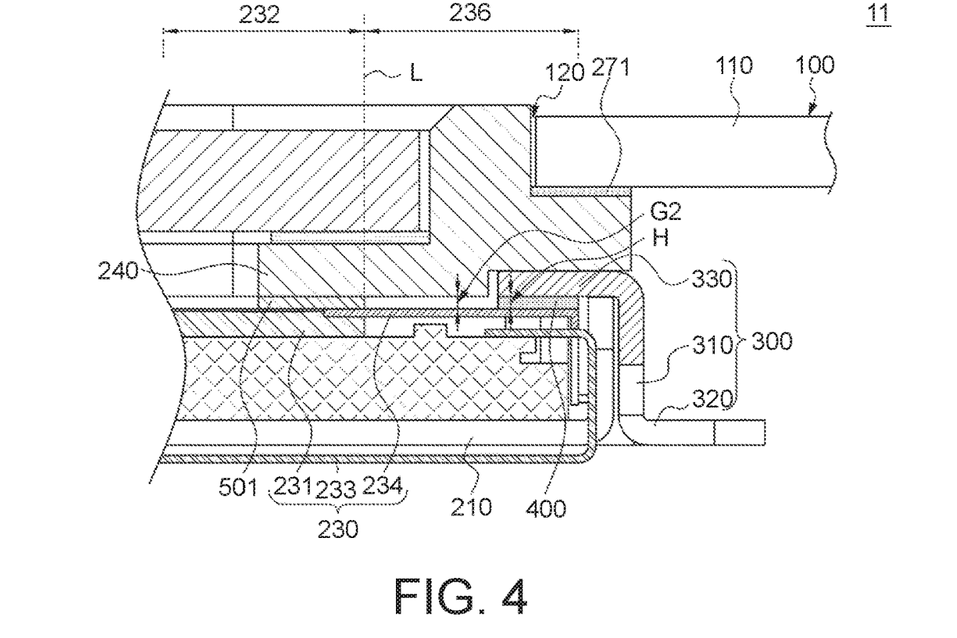
FIG. 4 shows a partially cross-sectional view of an electronic device according to one embodiment of the present disclosure, the viewing direction of which is the same with FIG. 3.

FIG. 4 shows a partially cross-sectional view of an electronic device 11 according to one embodiment of the present disclosure. One of the differences between the electronic device 11 of FIG. 4 and the electronic device 10 of FIG. 3 is that in the electronic device 11, the insulating sheet 501 is located between the exposing area 232 of the display module 230 and the cover 240, and covers a portion of the exposing area 232. In other words, the insulating sheet 501 does not cover the non-exposing area 236 of the display module 230. In one embodiment, one side edge of the insulating sheet 501 is aligned with the edge of the exposing area 232 of the display module 230, so that the side edge of the insulating sheet 501 and the edge of the exposing area 232 of the display module 230 form a boundary line L (as shown in FIG. 4). Therefore, the bottom surface of the cover 240, the non-exposing area 236, the boundary line L and the side surface of the soft element 400 define a gap G2 therebetween. In the present embodiment, the gap G2 and the spacing H substantially have the same height, but the present disclosure is not limited thereto. The width of the gap G2 in FIG. 4 is larger than the gap G1 in FIG. 3. The wider gap G2 reduces the area where the external force presses the non-exposing area 236 through the insulating sheet 501. It is worth noting that in the electronic device 11 or the electronic device 10 without the soft element 400, the above-mentioned gaps G1, G2 may be defined together by the cover 240, the insulating sheet 500, the display module 230 and the buffer 300 (or the hook 330).

Figure 5:
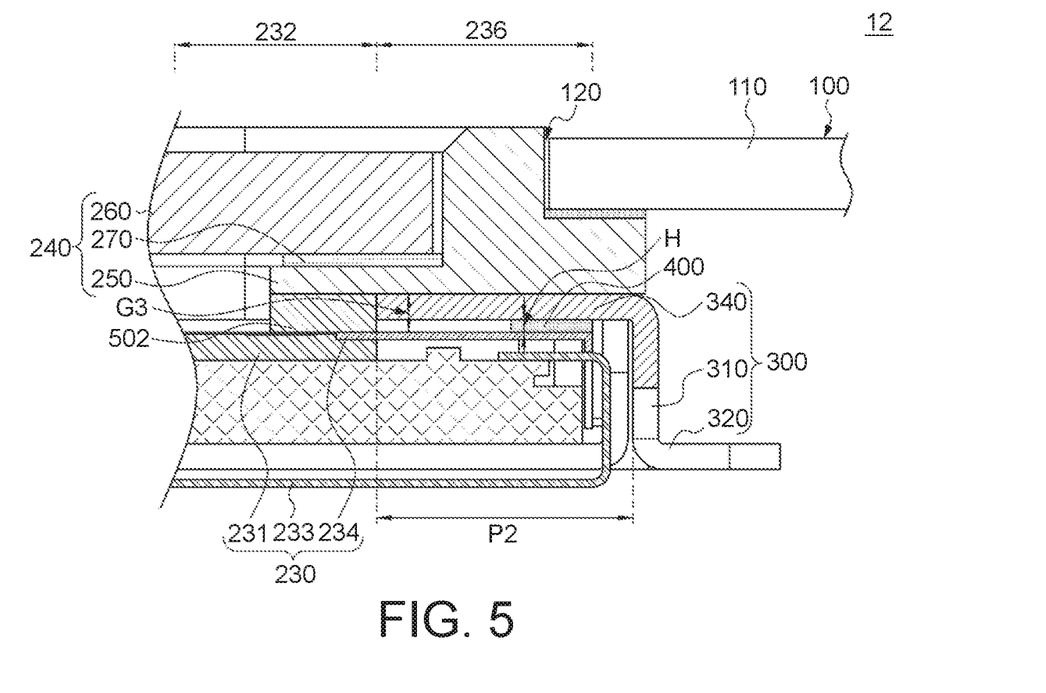
FIG. 5 shows a partially cross-sectional view of an electronic device according to one embodiment of the present disclosure, the viewing direction of which is the same with FIG. 3.

FIG. 5 shows a partially cross-sectional view of an electronic device 12 according to one embodiment of the present disclosure. One of the differences between the electronic device 12 of FIG. 5 and the electronic device 10 of FIG. 3 is that in the electronic device 12, the insulating sheet 502, the cover 240, the soft element 400 and the display module 230 together define a gap G3, and the hook 340 is located in the gap G3. That is, the outer frame 250 in the electronic device 12 does not have an accommodation portion (e.g., the recess region 253C in the electronic device 10). In the electronic device 12 of FIG. 5, the hook 340 of the buffer 300 directly contacts with the cover 240, and completely shields the non-exposing area 236 of the display module 230. More specifically, an orthogonal projection P2 of the hook 340 to the display module 230 completely overlaps the non-exposing area 236 of the display module 230. In the present embodiment, the gap G3 is defined by the side surface of the insulating sheet 502, the bottom surface of the cover 240 and the top surface of the display module 230 (i.e., the surface of the display module 230 facing the cover 240). Furthermore, the electronic device 12 may not have the insulating sheet 502, either. In the present disclosure, the height of the gap G3 is substantially larger than the spacing H, but the present disclosure is not limited thereto.

Figure 6:
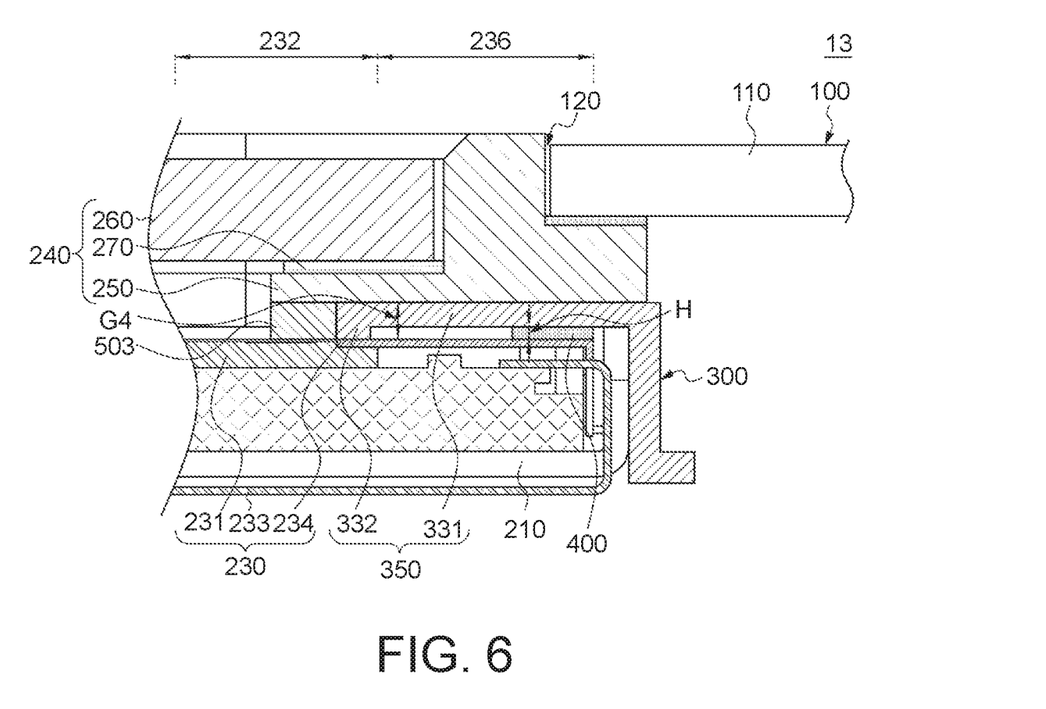
FIG. 6 shows a partially cross-sectional view of an electronic device according to one embodiment of the present disclosure, the viewing direction of which is the same with FIG. 3.

FIG. 6 shows a partially cross-sectional view of an electronic device 13 according to one embodiment of the present disclosure. One of the differences between the electronic device 13 of FIG. 6 and the electronic device 10 of FIG. 3 is that in the electronic device 13, the insulating sheet 503, the cover 240, the soft element 400 and the display module 230 together define a gap G4, and the hook 350 is located in the gap G4. That is, the outer frame 250 in the electronic device 13 does not have an accommodation portion (e.g., the recess region 253C in the electronic device 10). More specifically, the gap G4 is defined by the side surface of the insulating sheet 503, the bottom surface of the cover 240 and the top surface of the display module 230 (i.e., the surface of the display module 230 facing the cover 240). It is worth noting that in the electronic device 12 or the electronic device 13 without the soft element 400, the above-mentioned gaps G3, G4 may be defined together by the cover 240, the insulating sheet 500 and the display module 230.

Furthermore, the buffer 300 (or the hook 350) of the electronic device 13 includes an extending portion 331 and a connecting portion 332. Referring to FIG. 6, the extending portion 331 and the connecting portion 332 are located between the cover 240 and the display module 230. One surface of the extending portion 331 directly contacts the bottom surface of the outer frame 250 of the cover, and a spacing H exists between another surface of the extending portion 331 and the display module 230. One end of the connecting portion 332 is connected to the extending portion 331, and another end of the connecting portion 332 abuts the display module 230. In one embodiment, the connecting portion 332 directly contacts with the frame 234 and is located on the exposing area 232. The connecting portion 332 and the extending portion 331 are integrally formed, but the present disclosure is not limited thereto. In other words, the connecting portion 332 is located between the extending portion 331 and the display module 230, and a spacing H is formed among the extending portion 331, the connecting portion 332 and the display module 230. Therefore, the extending portion 331 is not in contact with or connected to the display module 230. In the present embodiment, the height of the gap G4 is substantially larger than the spacing H, but the present disclosure is not limited thereto.

Figure 7:
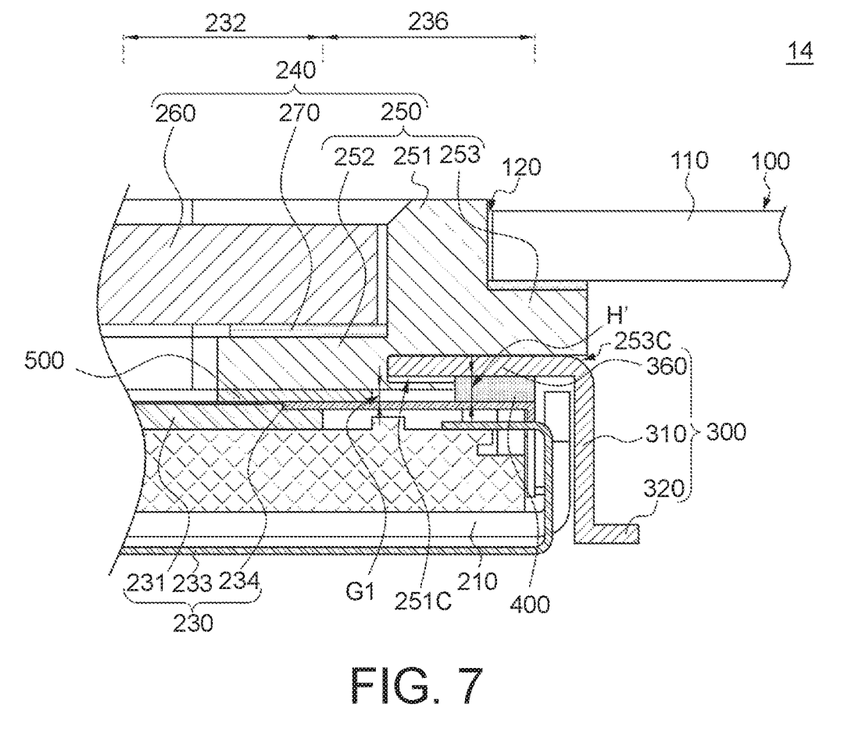
FIG. 7 shows a partially cross-sectional view of an electronic device according to one embodiment of the present disclosure, the viewing direction of which is the same with FIG. 3.

FIG. 7 shows a partially cross-sectional view of an electronic device 14 according to one embodiment of the present disclosure. One of the differences between the electronic device 14 of FIG. 7 and the electronic device 10 of FIG. 3 is that in the electronic device 14, the accommodation portion further includes a recess 251C communicating with the recess region 253C, and a spacing H' exists between the hook 360 of the buffer 300 and the non-exposing area 236. Specifically, the recess 251C is concave from a surface of the outer frame 250 facing the recess region 253C to the second surrounding space 252R. The hook 360 inserts into the recess 251C through the recess region 253C. In the present embodiment, the buffer 300 directly contacts with a surface of the outer frame 250 corresponding to the recess region 253C and the recess 251C by the hook 360. Thus, the contact area of the buffer 300 and the cover 240 includes a range corresponding to the recess region 253C and the recess 251C. In one embodiment, the hook 360 may not contact with a surface of the cover 240 corresponding to the recess region 253C. That is, the buffer 300 merely abuts a surface of the cover 240 corresponding to the recess 251C. It is worth to note that in another embodiment, the bottom surface of the outer frame 250 may be concave from the outer side of the outer ring portion 253 to the inner ring portion 252 to form the recess 251C. In other words, the accommodation portion of the outer frame 250 may only include the recess 251C without including the recess region 253C.

Figure 8:
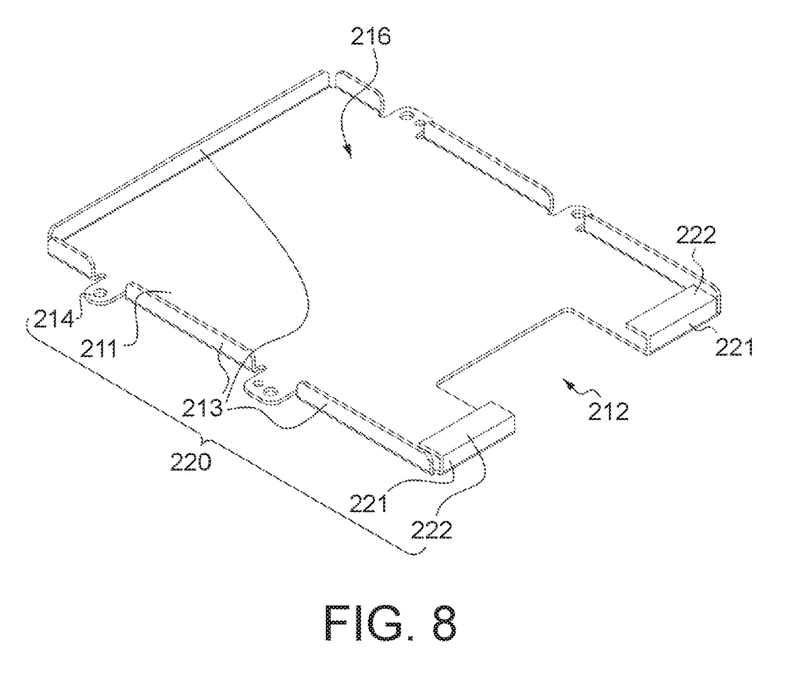
FIG. 8 shows a three-dimensional view of a holder of an electronic device according to one embodiment of the present disclosure.
Figure 9:
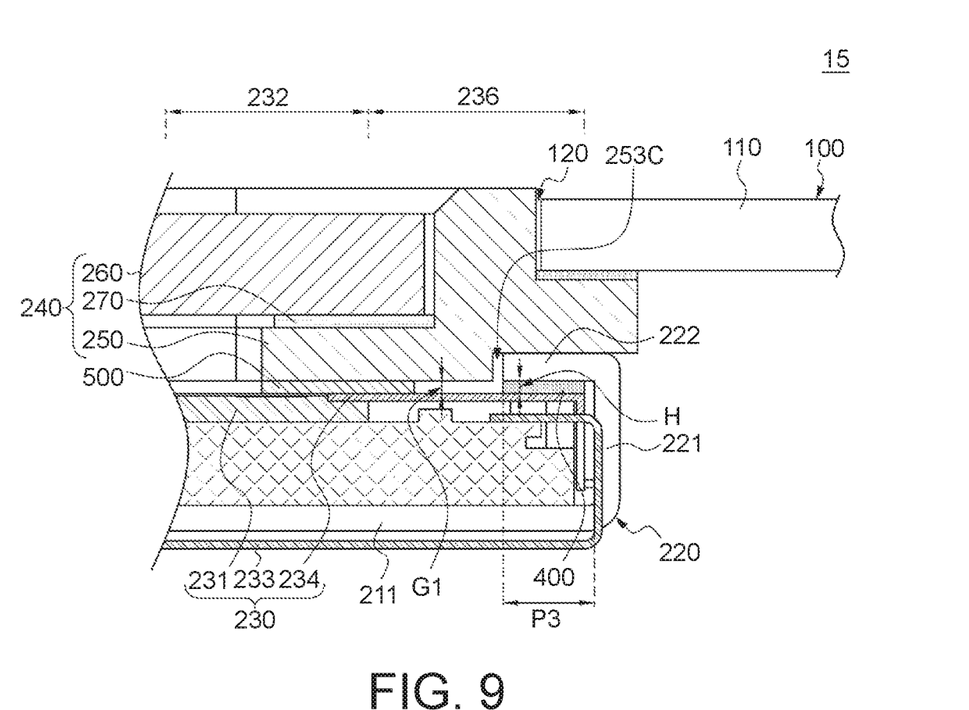
FIG. 9 shows a partially cross-sectional view of the electronic device according to the embodiment of FIG. 8, the viewing direction of which is the same with FIG. 3.

FIG. 8 shows a partially cross-sectional view of an electronic device 15 according to one embodiment of the present disclosure. FIG. 9 shows a partially cross-sectional view of the electronic device 15 according to the embodiment of FIG. 8, the viewing direction of which is the same with FIG. 3. The electronic device 15 shown in FIG. 9 is substantially the same as the electronic device 10 of FIG. 3, and the same components are denoted by the same reference numerals. One of the differences between the electronic device 15 of FIG. 9 and the electronic device 10 of FIG. 3 is that the electronic device 15 of FIG. 9 includes a holder 220 and at least one buffer 222 connected to the holder 220. The buffer 222 is laterally disposed between the cover 240 and the display module 230.

Specifically, as shown in FIG. 8 and FIG. 9, the holder 220 has a bottom plate 211 and a plurality of side plates 213, 221 connected to the bottom plate 211. The receiving opening 212 is located between two side plates 221. Furthermore, the bottom plate 211 and the side plates 221, 213 together form an accommodation space 216. The shape of the accommodation space 216 is substantially the same as the shape of the electronic element accommodated in the accommodation space 216 (e.g., the display module 230), but the present disclosure is not limited thereto. One end of each side plate 221 is connected to the bottom plate 211, and another end of each side plate 221 is connected to one end of the buffer 222. Another end of the buffer 222 extends from the side plate 221 to the accommodation space 216. Referring to FIG. 9, the buffer 222 extends from the non-exposing area 236 to the exposing area 232 into the recess region 253C. Thus, the buffer 222 is located between the cover 240 and the non-exposing area 236. The buffer 222 and the side plate 221 are integrally formed. For example, the buffer 222 is formed by bending the side plate 221 at a predetermined length, or the buffer 222 and the side plate 221 are connected to each other, but the present disclosure is not limited thereto. In the present embodiment, the bottom plate 211 of the holder 220 and the side plates 221, 213 may also be integrally formed, and the holder 220 may be made from metal or plastic.

It is worth noting that the buffers in the above embodiments may also be used in the electronic device whose housing does not have opening or window. Therefore, the stopping structure may not have the cover. In one embodiment, the buffer (or the hook) is disposed between the housing and the electronic element, and abuts or directly contacts with the housing. In another embodiment, the housing of the electronic device has a first portion and a second portion, and the buffer has a hook and a base. The hook is disposed between the first portion of the housing and the electronic element, and abuts or directly contacts with the first portion of the housing. The base is firmly disposed on the second portion of the housing.

In the above embodiments, the buffer supports the cover and the housing, and is disposed above the non-exposing area of the electronic element. When an external force is applied to the housing or the cover, the buffer may provide a supporting strength to prevent the electronic element from being damaged due to an excessive compression to the cover by the external force, thereby preventing the component of the electronic element from being damaged. As a result, the electronic device and the stopping structure thereof may have better pressure resistance and shock resistance. In addition, the present disclosure may also be applied to a waterproof electronic device. Therefore, the chance of damage to the structure of the waterproof electronic device may be reduced with a better pressure resistance, thereby improving the waterproof function of the waterproof electronic device. Furthermore, since the electronic element may be disposed between the holder and the buffer, the electronic element may be restricted by the buffer to prevent from falling off from the holder. Thus, the electronic element may be firmly disposed on the holder.

Although a display module is exemplified as the electronic element in the above embodiments, the present disclosure is not limited thereto. In other embodiments, the electronic element may also be other element. For example, the electronic device in the above embodiments may be an image-capturing device, such a mobile phone, a camera and a video camera, or a security monitoring device, and the electronic element may be a lens or a lamination light of the above devices. However, the present disclosure is not limited thereto.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An electronic device comprising:
   a housing having a first portion and a second portion;
   an electronic element; and
   an elastomer having a hook and a base, the hook and the base located at different heights and respectively extending towards opposite directions, the hook disposed between the first portion and the electronic element and abutting the first portion, and the base firmly disposed on the second portion.

2. The electronic device according to claim 1, wherein a spacing exists between the hook and the electronic element.

3. The electronic device according to claim 1, wherein the hook comprises an extending portion and a connecting portion, one end of the connecting portion connects to the extending portion, another end of the connecting portion abuts the electronic element, and the extending portion, the connecting portion and the electronic element forms a spacing.

4. The electronic device according to claim 1, wherein the electronic element has an exposing area and a non-exposing area, and an orthogonal projection of the hook to the electronic element overlaps the non-exposing area.

5. The electronic device according to claim 4, wherein the electronic element is a display module, the exposing area of the electronic element has an active area of the display module, and the non-exposing area of the electronic element has an outer lead bonding area of the display module.

6. The electronic device according to claim 4, further comprising an insulating sheet disposed on the electronic element, and the insulating sheet covers at least one of a first region of the exposing area adjacent to the non-exposing area and a second region of the non-exposing area.

7. An electronic device comprising:
   a housing having an opening;
   an electronic element disposed corresponding to the opening;
   a cover comprising an outer frame coupling to a peripheral edge of the opening; and
   a buffer having a hook on the electronic element, the hook disposed between the outer frame and the electronic element, the hook contacting with the outer frame, and a spacing being between the hook and the electronic element.

8. The electronic device according to claim 7, wherein the hook comprises an extending portion and a connecting portion, one end of the connecting portion connects to the extending portion, another end of the connecting portion abuts the electronic element, and the extending portion, the connecting portion and the electronic element forms the spacing.

9. The electronic device according to claim 7, wherein the electronic element has an exposing area and a non-exposing area, and an orthogonal projection of the hook to the electronic element overlaps the non-exposing area.

10. The electronic device according to claim 9, wherein the electronic element is a display module, the exposing area of the electronic element has an active area of the display module, and the non-exposing area of the electronic element has an outer lead bonding area of the display module.

11. The electronic device according to claim 9, further comprising an insulating sheet disposed on the electronic element, and the insulating sheet covers at least one of a first region of the exposing area adjacent to the non-exposing area and a second region of the non-exposing area.

12. An electronic device comprising:
    a housing having an opening;
    a cover having an outer frame coupling to a peripheral edge of the opening;
    a holder having a side plate;
    an electronic element disposed correspondingly to the opening on the holder; and
    a buffer disposed between the outer frame and the electronic element, and one end of the buffer connects to the side plate.

13. The electronic device according to claim 12, wherein the electronic element is a display module, and a first section of the buffer is disposed between the cover and a non-exposing area of the display module, or a spacing exists between the first section of the buffer and the non-exposing area.

14. The electronic device according to claim 12, wherein a second section of the buffer is disposed on the housing.

15. The electronic device according to claim 12, wherein the buffer is made from at least one of metal, plastic and rubber, or a combination of metal, plastic and rubber with other component.

16. The electronic device according to claim 12, wherein the buffer is formed into a zigzag, or a shape of bending structure.

17. A stopping structure adapted for an electronic device, the electronic device comprising a housing and an electronic element, the stopping structure comprising:
- a cover having an outer frame;
- a holder having a side plate; and
- a buffer comprising a hook, the outer frame abutting a first surface of the hook, and the side plate abutting a second surface of the hook opposite to the first surface;
- wherein the outer frame of the cover couples to a peripheral edge of an opening of the housing, and the electronic element is disposed correspondingly to the opening on the holder.

18. The electronic device according to claim 17, wherein the buffer is made from at least one of metal, plastic and rubber, or a combination of metal, plastic and rubber with other component.

19. The electronic device according to claim 18, wherein the buffer is formed into a zigzag, or a shape of bending structure.

* * * * *